(12) United States Patent
Gilchrist et al.

(10) Patent No.: US 7,109,509 B2
(45) Date of Patent: Sep. 19, 2006

(54) DEVICE FOR THE DETECTION OF SUBSTRATES STACKED WITH A SPECIFIC SPACING

(75) Inventors: Ulysses Gilchrist, Reading, MA (US); Louise S. Barriss, North Reading, MA (US); Hagen Raue, Göda (DE); Berndt Lahne, Rothenstein (DE); Manfred Heinze, Dresden (DE); Joachim König, Bannewitz (DE); Klaus Schultz, Jena (DE)

(73) Assignee: Brooks Automation, Inc., Chelmsford, MA (US)

( * ) Notice: Subject to any disclaimer, the term of this patent is extended or adjusted under 35 U.S.C. 154(b) by 88 days.

(21) Appl. No.: 10/692,047

(22) Filed: Oct. 23, 2003

(65) Prior Publication Data
US 2004/0188641 A1 Sep. 30, 2004

(30) Foreign Application Priority Data
Oct. 25, 2002 (DE) .............................. 102 50 353

(51) Int. Cl.
*G01N 21/00* (2006.01)
*G01V 8/12* (2006.01)
(52) U.S. Cl. ........................... 250/559.29; 250/559.33; 250/559.4; 414/411; 414/416.03; 414/416.08; 414/937
(58) Field of Classification Search ........... 250/559.29, 250/559.33, 559.36, 559.4, 221, 222.1; 414/411, 414/416.03, 416.08, 937
See application file for complete search history.

(56) References Cited

U.S. PATENT DOCUMENTS

| | | | |
|---|---|---|---|
| 5,605,428 A * | 2/1997 | Birkner et al. ......... 414/331.15 |
| 5,772,386 A * | 6/1998 | Mages et al. ................ 414/411 |
| 5,906,469 A | 5/1999 | Oka et al. .................... 414/416 |
| 6,052,193 A | 4/2000 | Kim et al. ................... 356/388 |
| 6,053,983 A * | 4/2000 | Saeki et al. ................. 118/728 |
| 6,082,949 A * | 7/2000 | Rosenquist ................. 414/217 |
| 6,147,356 A | 11/2000 | Hahn et al. ............. 250/559.29 |
| 6,188,323 B1 * | 2/2001 | Rosenquist et al. ...... 340/686.5 |
| 6,211,514 B1 * | 4/2001 | Schultz et al. ........... 250/222.1 |

(Continued)

FOREIGN PATENT DOCUMENTS

DE 4306957 C1 6/1994

(Continued)

*Primary Examiner*—Thanh X. Luu
*Assistant Examiner*—Davienne Monbleau
(74) *Attorney, Agent, or Firm*—Perman & Green, LLP; Richard Pickreign

(57) ABSTRACT

For a device for the detection of substrates stacked at an opening of a wall element, there existed the problem of constructing the detection device in such a way that the detection of the position of the substrates can be performed more flexibly with respect to the course of measurement and the measuring method employed and a defined approach of a sensor system to the semiconductor substrate to be detected is ensured in a definite position of measurement with a lowered risk of particle generation.

Figure 1:
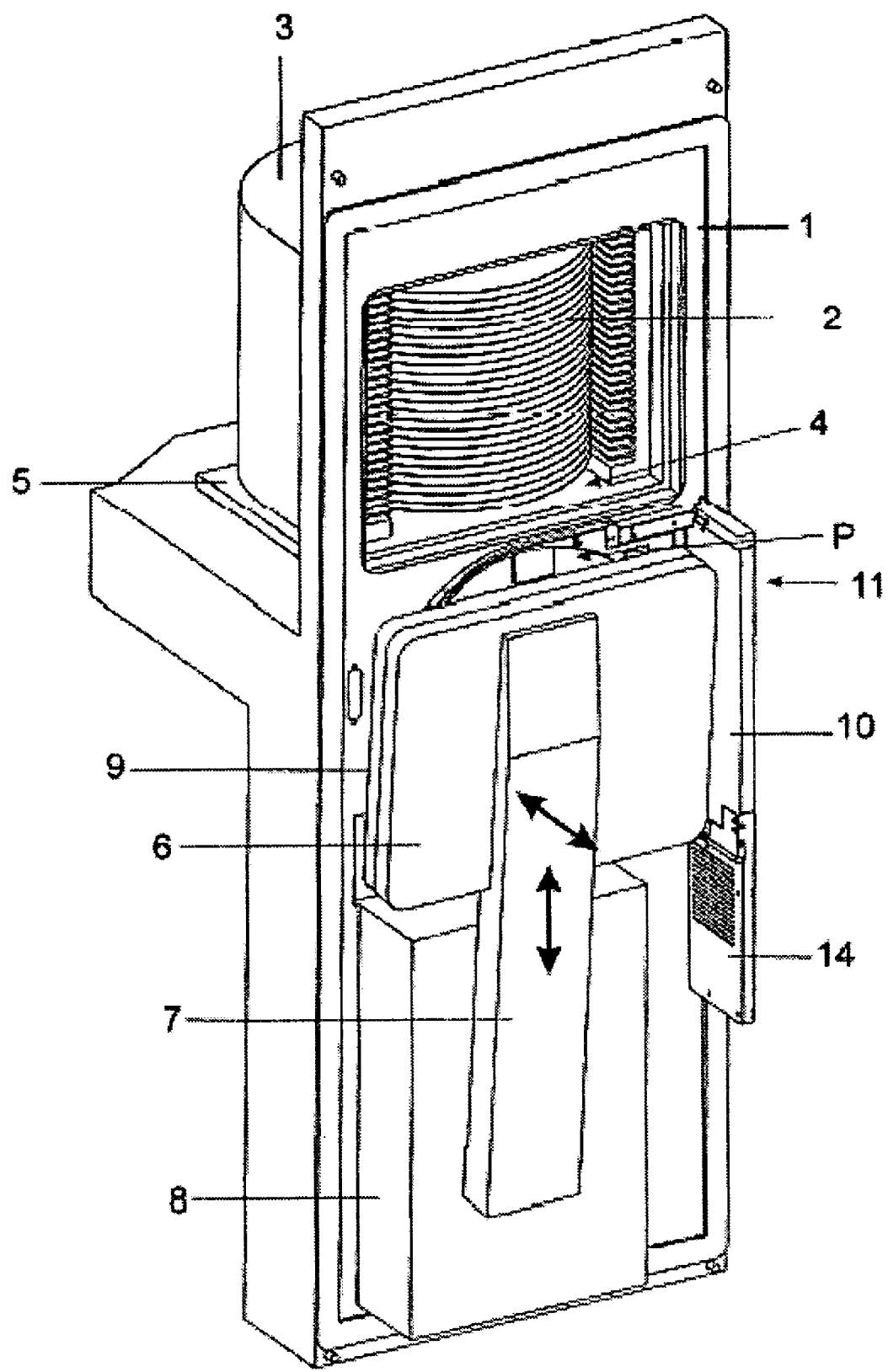

A transmitting and receiving device (11) consists of a vertical drive mechanism (10) mounted on the wall element (1) and a sensor head (13) that can be adjusted between a lower and an upper position by means of the vertical drive mechanism (10), said sensor head being arranged so as to pivot on the vertical drive mechanism (10) in order to pivot into the opening (4).

The device finds application, in particular, in the semiconductor industry for recording the state of occupancy of cassettes or containers with substrates, such as semiconductor wafers, flat-screen displays, or masks.

10 Claims, 5 Drawing Sheets

U.S. PATENT DOCUMENTS

| | | |
|---|---|---|
| 6,220,808 B1 * | 4/2001 | Bonora et al. ............... 414/217 |
| 6,419,439 B1 * | 7/2002 | Schlehahn et al. ..... 414/331.18 |
| 6,452,201 B1 * | 9/2002 | Wang et al. ............ 250/559.29 |
| 6,470,927 B1 * | 10/2002 | Otaguro ........................ 141/98 |
| 6,655,423 B1 * | 12/2003 | Rush et al. .................... 141/98 |
| 6,795,202 B1 * | 9/2004 | Emoto et al. ................ 356/630 |
| 6,824,344 B1 * | 11/2004 | Otaguro ................... 414/217.1 |
| 6,869,263 B1 * | 3/2005 | Gilchrist ..................... 414/217 |
| 2001/0009641 A1 | 7/2001 | Haraguchi et al. ..... 414/416.03 |
| 2004/0099826 A1 * | 5/2004 | Igarashi et al. ........ 250/559.29 |

FOREIGN PATENT DOCUMENTS

| | | |
|---|---|---|
| DE | 19535871 A1 | 4/1997 |
| DE | 19728478 A1 | 2/1999 |
| DE | 19853446 A1 | 5/2000 |
| JP | 2001284439 A * | 10/2001 |
| JP | 2002093885 | 3/2002 |

* cited by examiner

DEVICE FOR THE DETECTION OF SUBSTRATES STACKED WITH A SPECIFIC SPACING

The invention concerns a device for the detection of substrates stacked with a specific spacing at an opening of a wall element with a closure for the opening, it being possible for this closure to be adjusted in at least two different directions relative to the wall element by means of a drive mechanism that is positioned below the opening and having a transmitting and receiving device for emitting and receiving a horizontally directed measuring beam.

When substrates, such as semiconductor wafers, flat-screen displays, or masks are processed, these are individually stowed, as a rule, in compartments of a container in order to be able to handle them with automatic equipment. On account of the large number of technological steps, it is necessary, because of the high expenditure associated therewith, to prevent or limit to a minimum any damage that may arise owing to faults during the handling of the substrates and lead to their unfitness for use.

For this reason, a presence and occupancy check, a so-called mapping, is usually carried out prior to removal of the substrate from the container, this check serving, in particular, to identify empty container compartments, the double occupancy of a container compartment, or oblique positioning of the substrate across one or more container compartments. In addition, the handling system is able to operate more effectively and avoid idling routines through a precise identification of the actual positions of the substrates.

Known detection devices operate as stationary optical systems or as mobile systems based on light barriers.

A known, stationary optical system in accordance with U.S. Pat. No. 6,147,356 is constructed in such a way that at least two, linearly extended series of light sources are arranged parallel to a group of levels predetermined by the container compartments and substrates and lie in a plane parallel to the edge regions to be detected. Arranged between the series of light sources, positioned in parallel, is a lens, by means of which a large number of container compartments are imaged simultaneously on a sensor array, from which it is possible to read out at least portions of an edge region of the substrate with a sufficient transversal extension that, when it is imaged, an irregularity present in the edge region is always smaller than the portions of the edge region that are read out.

Although this solution permits the detection of the substrate independently of its orientation and of discontinuities in its edge region, there still remains the general drawback of stationary optical systems, namely that it is fundamentally essential for an adequate reflectivity to exist in the edge region.

Sensor systems operating on the basis of light barriers are able to overcome this drawback, an example being a device in accordance with U.S. Pat. No. 6,188,323 B1, in which the sensor system is linked to a door provided for the loading and unloading opening. The sensor system, in which transmitter and receiver, arranged opposite each other and facing each other, are mounted on folding levers, detects the presence of the substrate in the container while the door is lowered. To this end, the levers fold out in the direction of the substrate at the start of the opening operation and retract once again at the end of the opening and measuring operation. The vertical position of the drive mechanism of the door is utilized for position identification.

Although additional process steps are avoided by linking the identification process to the course of movement of the door, there results, once again, an inflexibility of the system, because intervening measurements are ruled out or initially necessitate the door closing operation. In addition, the solution is associated with an elevated risk of particle generation, because elements of the drive mechanism are brought into the vicinity of the wafer and the large-area door can lead, during its movement, to air swirls.

Sensor systems linked to the handling device also have the drawback of being less flexible.

Starting from this, the problem of the invention is to design the detection device in such a way that the detection of the position of the substrate can be performed more flexibly with respect to the course of measurement and the method of measurement employed and a defined approach of a sensor system toward the semiconductor substrate to be detected is ensured in a definite position of measurement with a lowered risk of particle generation.

This problem is solved for a device of the kind mentioned at the beginning in that the transmitting and receiving device consists of a vertical drive mechanism mounted on the wall element and a sensor head that can be adjusted between a lower position and an upper position by means of the vertical drive mechanism, this sensor head being mounted in rotating manner on the vertical drive mechanism so that it can pivot into the opening.

The device in accordance with the invention permits a higher flexibility of the courses of measurement for detecting position, because this device is not tied to a course of movement of another functional unit, such as, for example, that of the closure during opening and closing of the opening in the wall element or that of a handling system that serves to remove and return the substrate, but is not a part of the device in accordance with the invention.

In addition, the course of movement of the transmitting and receiving device has no interfering effect whatsoever on the other courses of movement, because the vertical drive mechanism is mounted below the opening and outside the region of movement of the closure.

Also serving for a defined approach toward the substrate to be detected is an advantageous embodiment, in which the vertical drive mechanism supports the sensor head on a pivoting head with a horizontally directed pivot axis, this pivoting head being mounted on a vertically extending arm. Here, the pivot axis can run through a hollow shaft, on which the sensor head is placed and which can rotate between two terminal positions.

A special embodiment of the invention provides for the design of the sensor head as a forked light barrier, in which, at one end of the fork, a transmitter is mounted for emitting a measuring beam directed along a measuring beam path toward the other end of the fork and, at the other end of the fork, there is provided a beam deflection device, from which an optical fiber, which is coupled to the device, leads outside of the measuring beam pathway by means of optics to a receiver at the first end of the fork in a lighttight manner. This embodiment makes it possible, on the one hand, to construct the transmitter and receiver as one unit with the free end of the fork not being encumbered by a receiver and, on the other hand, to exclude any interference by scattered or outside light.

Here, the measured object, which is passed between the two ends of the fork during the vertical movement of the sensor head, is recorded by the receiver in the transmission technique and is evaluated by an electronic control and analysis unit that is connected to the receiver.

Because the vertical drive mechanism is constructed as a motor-spindle combination, which has an encoder for identifying the vertical positions, this encoder being linked to the electronic control and analysis unit of the transmitting and receiving device, the measured signals obtained from the receiver are to be assigned to the positions determined.

The arrangement of transmitter and receiver next to each other at the same end of the fork, the return of the measuring beam via the optical fiber, and its lighttight coupling to the receiver ensure a determination of the measured value that is independent of material properties. It is ensured that only the emitted measuring beam that is not blocked by the measured object in the measuring beam path reaches the receiver. The influences of outside light, which can arise through illumination, specular reflections, or reflections on the surfaces that are present and can have an interfering effect on the measured signal, are excluded with the present sensor head, in contrast to the known measuring devices.

In addition, as a result of the beam guidance through the optical fiber, the sensor head is characterized by a very small structural volume and a very reduced weight, and this substantially decreases vibrational effects during raising and pivoting.

The pivoting arrangement of the forked light barrier on the vertical drive mechanism can be designed advantageously in such a way that the horizontally directed pivot axis runs parallel to and at a spacing from the measuring beam path, so that the ends of the fork pass through the opening in the wall element when pivoting around the pivot axis occurs. In this way, a compact device with a measuring beam path that can brought toward the substrate to be detected is produced.

An especially advantageous effect is achieved when a laser with a measuring beam of great light-transmitting capacity and a small angle of beam spread serves as transmitter, which can be adjusted precisely to the thickness of the substrate.

An advantageous enhancement of the invention consists in providing the transmitting and receiving device with its own electronic control and analysis unit, connected to a bus system of a central logic control.

The transmitting and receiving device, which, owing to its constructional design, is especially suited for subsequent incorporation into existing loading and unloading stations, can thus be designed as a component of a modular system of functional units, in which each functional unit is equipped with its own electronic control and analysis unit, which is connected through the bus system to the central logic control. The electronic control and analysis unit of the transmitting and receiving device as well as that of the other functional units, such as, for example, that of the closure, can be separated in a simple way by the bus system. It is also possible to add additional functional units or to make an exchange, with immediate functional capability being ensured in each case.

Finally, in a further, alternative embodiment, the sensor head of the transmitting and receiving device can also be designed as a reflection measuring device, in which the transmitter and the receiver are arranged next to each other on the sensor head. The measuring beam emitted by the transmitter is recorded by the receiver after its reflection on the substrate to be detected instead of by means of the transmission technique.

Figure 2:
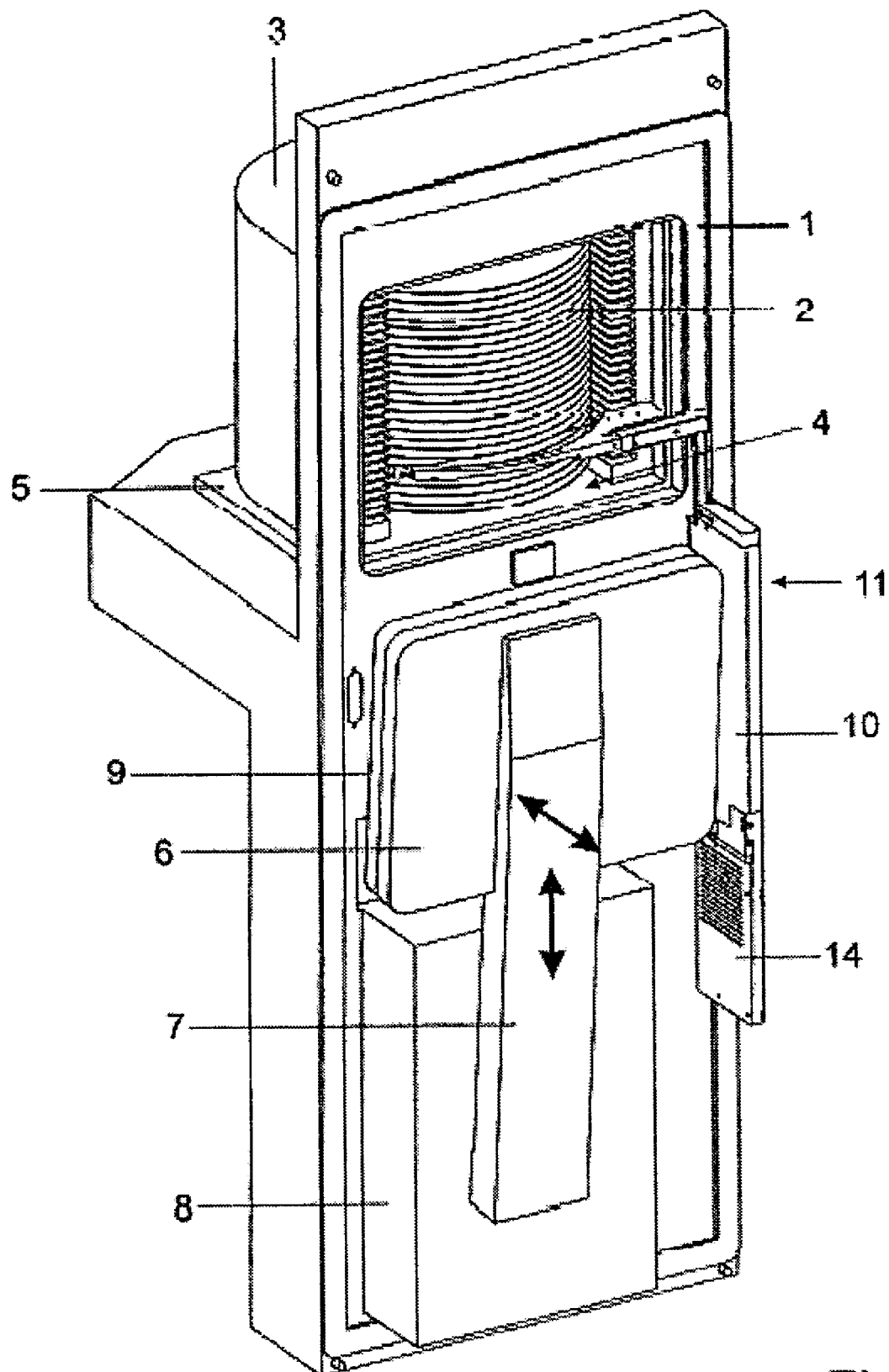
Figure 3:
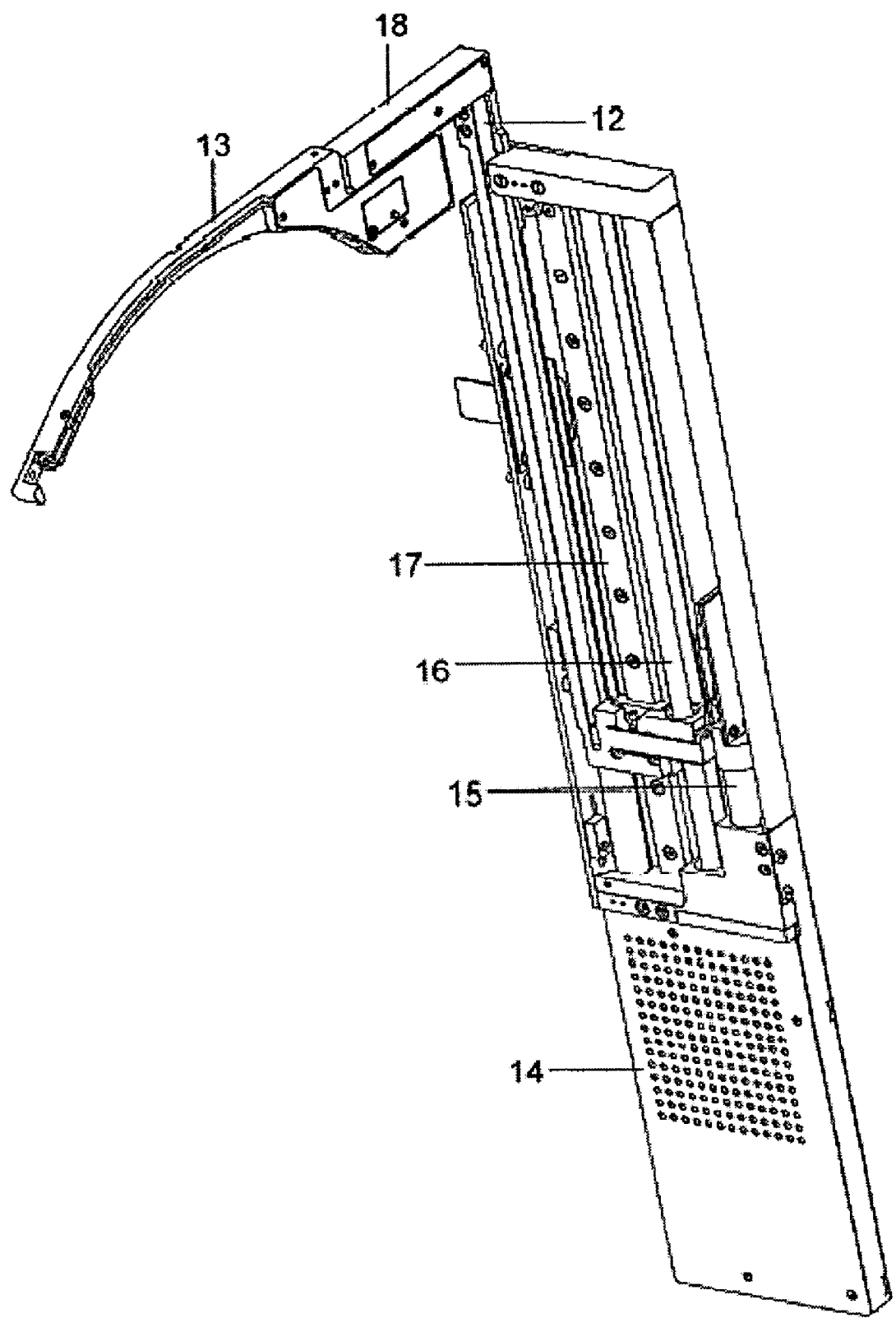
Figure 4:
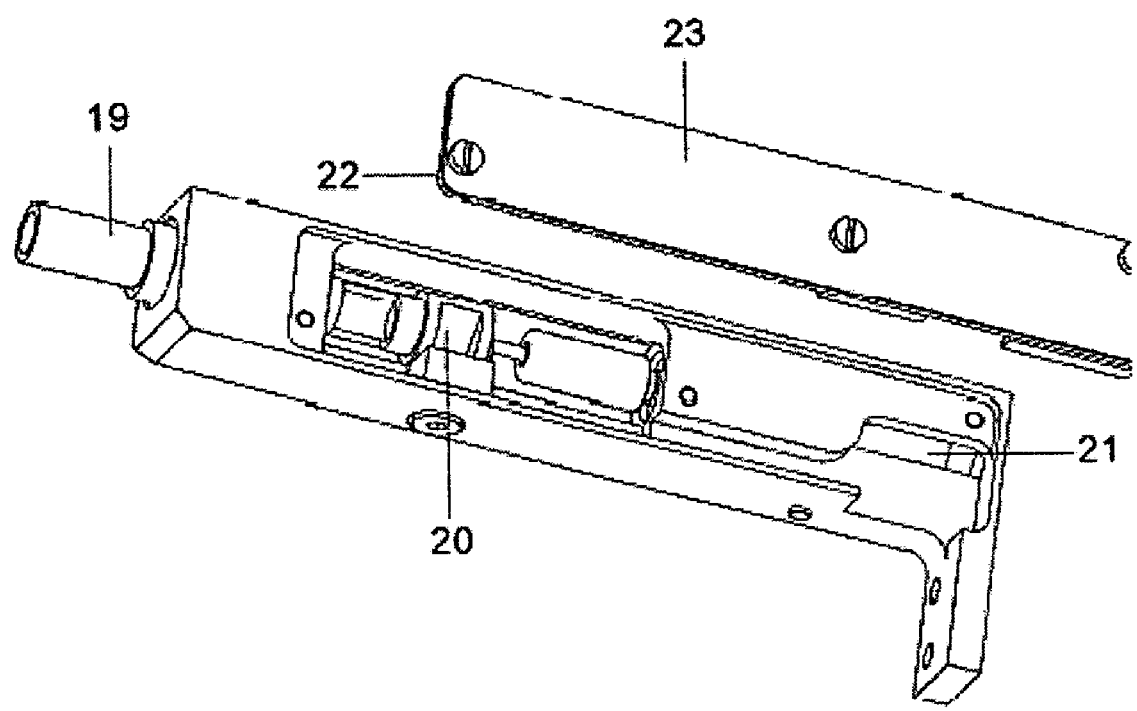
Figure 5:
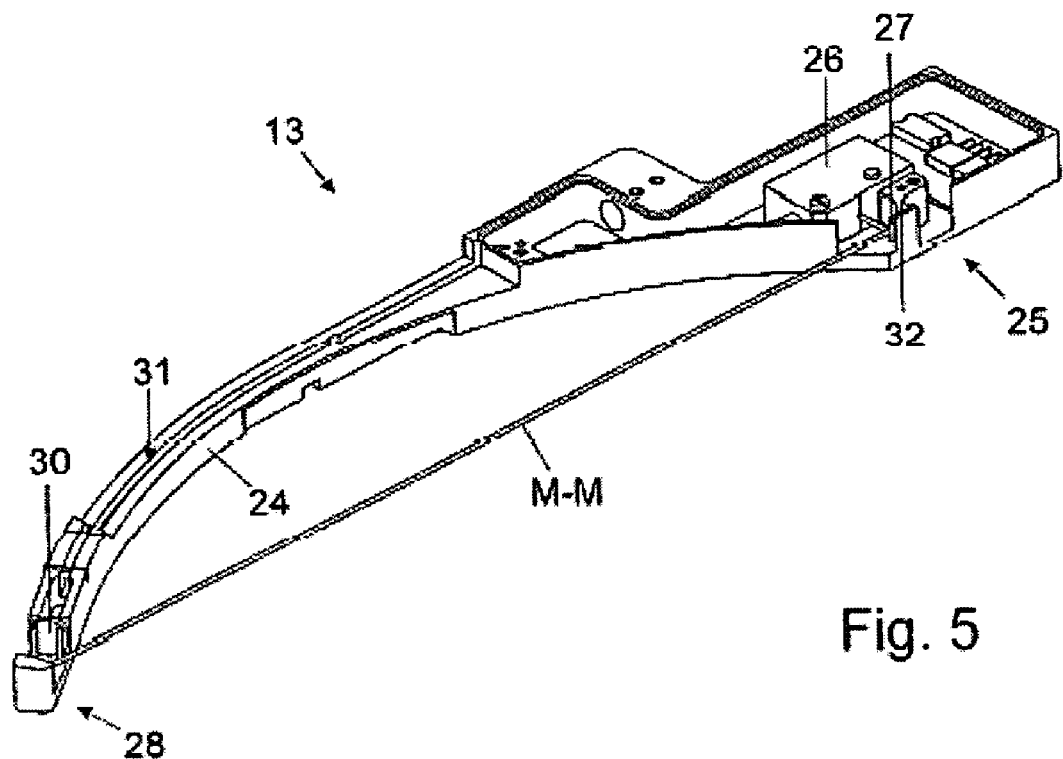
Figure 6:
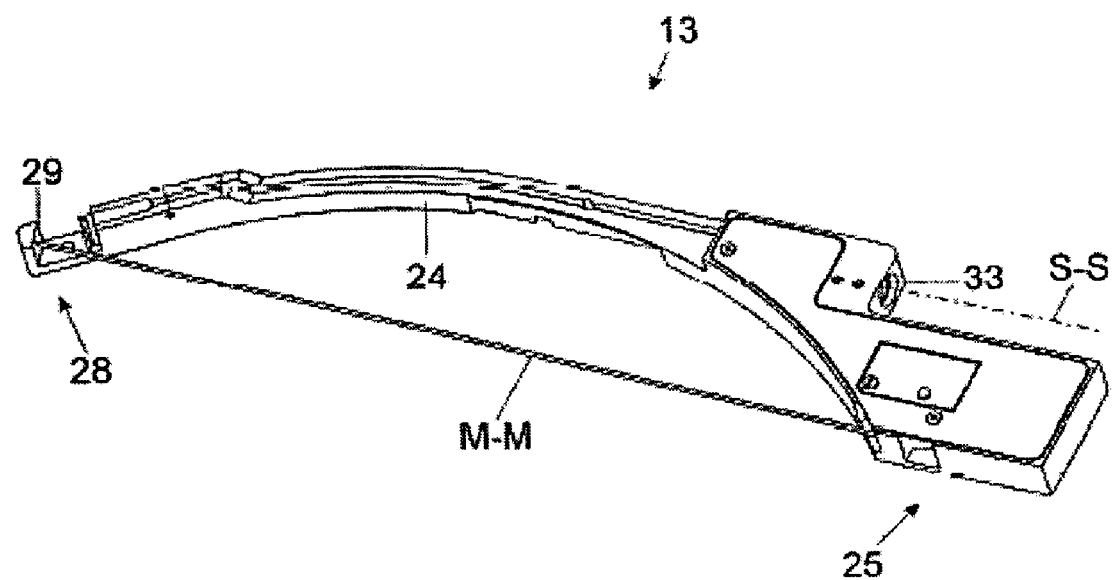

The invention is to be illustrated in greater detail below on the basis of the schematic drawing. Shown are the following:

FIG. 1 a device for the detection of stacked substrates with a transmitting and receiving device situated in the park position;

FIG. 2 the device in accordance with FIG. 1, in which the transmitting and receiving device is situated in a working position;

FIG. 3 the transmitting and receiving device;

FIG. 4 a pivoting head for adjustment of the sensor head from a resting position to a working position;

FIG. 5 a sensor head provided for the transmitting and receiving device in a first view with opened transmitting and receiving part;

FIG. 6 the sensor head in a second view.

In the device depicted in FIG. 1, an opening 4 serving for loading and unloading a container 3 loaded with semiconductor wafers 2 as substrates is incorporated into a frame-shaped wall element 1. For positioning of the container 3 at the opening 4, the former is placed on a platform 5, so that the side of it to be opened is aligned with the opening 4. A closure 6, situated in open position, is mounted on an arm 7 that can be adjusted in height and positioned against the wall element 1, for which purpose a drive means—for example, in the form a lifting cylinder—is provided in a housing part 8, both for adjustment of height and for positioning of the arm 7 against the wall element 1. For positioning against the wall element 1, the arm 7 can, in addition, pivot in the lower region around a horizontal axis. The closure 6 supports a container door 9 that, during the opening operation, has already been removed from the side of the container 3 to be opened.

Below the opening 4, laterally next to the housing part 8 and the drive means contained therein for the closure 6 and outside the region of movement of the closure 6, is mounted a vertical drive mechanism 10 of a transmitting and receiving device 11, which supports a sensor head 13 on an arm 12 that can be adjusted between a lower position and an upper position. In the depiction in accordance with FIG. 1, the sensor head 13 is situated in the lower position P, which serves as the resting position, and, in FIG. 2, it is in a working position lying between the lower position and the upper position, in which the sensor head 13 is brought in a defined manner toward the semiconductor wafers 2 by way of a 90° pivot with respect to the resting position and projects into the opening 4.

Structurally coupled to the vertical drive mechanism 10 is a housing part 14, in which the electronic control and analysis unit required for the transmitting and receiving device 11 is housed and, in a way not shown, is connected to a bus system of a central logic control.

The detailed depiction of the transmitting and receiving device 11 in accordance with FIG. 3 illustrates the vertical drive mechanism 10, which contains a DC servo drive motor 15, which is provided with an encoder and affords a high positional accuracy of less than 100 μm and which drives a precision spindle 16 via a toothed belt drive. The tensioning of the toothed belt is accomplished through an eccentric rotation of the motor. Coupled to the precision spindle 16 through a precision linear guide 17 in a freely moving manner is the arm 12, which can be extended vertically and is made of highly rigid material and which supports the sensor head 13, designed as a forked light barrier, on an angled pivoting head 18.

The pivoting head 18 contains a hollow shaft 19, which is depicted in FIG. 4, on which the sensor head 13 is placed so as to pivot between the positions of the resting position and the working position. The positions, which differ by 90°, are ensured through a terminal position stop 20 and an electrically adjusted holding torque of a DC drive motor 21 provided for driving the hollow shaft 19 and are reached through a speed profile.

For identification of the terminal position stop 20, (Hall) sensors on a printed circuit board 22 for switching on the sensors are provided on a closing plate 23.

The sensor head 13, depicted in FIGS. 5 and 6, is designed as a bow-shaped fork 24, which is minimized in weight, in which, on a first end of the fork 25, serving as transmitting and receiving part, is mounted a transmitter 26 in the form of a laser for emitting a measuring beam, which, in order to minimize the structural volume, is directed via a first deflecting mirror 27 along a measuring beam path M—M to the other end of the fork 28. A second deflecting mirror 29, incorporated into the structure of the fork 24 at the other end of the fork 28, couples the measuring beam, via a convex lens 30, into an optical fiber 31, which leads, outside of the measuring beam path M—M in the fork 24, by means of optics that are concealed here, to a receiver 32 at the first end of the fork 25 in a lighttight manner. The laser emitter 26 ensures an optimal focus on the edge of the semiconductor wafer 2 and thus an adequate resolution of the thickness of the semiconductor wafer 2.

Provided for placing the sensor head 13 on the hollow shaft 20 is a neighboring drilled hole 33 that is oriented parallel to and at a spacing from the measuring path beam M—M, this resulting in an pivot axis S—S for the sensor head 13, so that, when pivoting occurs around the pivot axis S—S, the ends of the fork 25 and 28 pass into the opening 4 in the wall element 1.

The device in accordance with the invention operates in such a way that a hindering of the opening functions, of access of a handling device, and of other functions is excluded by sensor elements set down by SEMI standards.

Once the opening operation for the opening 4 in the wall element 1 has concluded (FIGS. 1 and 2), for which the closure 6 has performed beforehand a first movement, directed away from the wall element 1, and subsequently a second vertical movement downwards, taking the container door 9 with it, the sensor head 13 is driven out of the park position P by means of the vertical drive mechanism 10 so far upwards that the ends of the fork 25 and 28 can be brought in a defined manner into a working position through the opening 4 towards the semiconductor wafer 2 to be detected by pivoting of the sensor head 13 around the pivot axis S—S through the opening 4. The pivoting occurs in the lowermost position possible, so that the risk of particle contamination is minimized.

Afterwards, the sensor head 13 is driven to the upper position above the uppermost position possible of a semiconductor wafer 2, the transmitter 26 and the receiver 32 are switched on, and the light barrier is tested. Subsequently, the sensor head 13 is driven downwards past all possible semiconductor wafers 2 by means of the vertical drive mechanism 10 and, without an intervening stop, the vertical coordinates of the light barrier interruptions are registered to detect the presence and the position of the semiconductor wafers 2 in the container 3. The vertical movement downwards is preferred, because, in this way, vibrational effects are reduced. Whereas the presence of a semiconductor wafer 2 ensues from a measuring beam interruption, the vertical position is determined from the measurement results (position) taken from the encoder on the vertical drive mechanism 10 at the time point of beam interruption and of the beam release. The position values that result can, in contrast to stationary optical systems, be processed further immediately and can, for example, be conveyed to a handling system.

Because the thickness of the semiconductor wafers 2 lies within defined limits, it is also possible to determine from the recorded difference between two measured values whether a double occupancy of a compartment or an oblique position of a semiconductor wafer 2 is present.

The data determined are fed to the electronic control and analysis unit, evaluated there, and, as saved results, brought to display on a monitor, which is not depicted.

Once the measuring operation has been concluded, the sensor head 13 is driven to the lowest possible return pivoting position, pivoted back there by 90° around the pivot axis S—S and thus pivoted out of the opening 4, and subsequently lowered to the park position P.

The advantage of the device in accordance with the invention is revealed in the fact that it is possible to assume an intermediate position at the upper edge of the opening 4, from which intervening measurements, if need be, are also possible.

Alternating courses of movement are also possible in order to optimize the time courses. The sensor is then pivoted in a lower position, assumes a lower start position, and determines the measured values during the movement to an upper end position. In this upper end position, the sensor bow is pivoted back and brought into a resting position above the opening. The subsequent measurement then takes place in the reverse sequence. This course makes it possible to reduce idling movements.

The invention claimed is:

1. A device for the detection of substrates stacked with a specific spacing at an opening of a wall element with a closure for the opening, it being possible for this closure to be adjusted in at least two different directions relative to the wall element by means of a drive mechanism that is positioned below the opening and having a transmitting and receiving device for transmitting and receiving a horizontally directed measuring beam, characterized in that the transmitting and receiving device comprises of a vertical drive mechanism mounted on the wall element independent from the drive mechanism, and a sensor head that can be adjusted between a lower and an upper position by means of the vertical drive mechanism, said sensor head being pivoted on the vertical drive mechanism so that it can pivot into the opening.

2. The device according to claim 1, further characterized in that the vertical drive mechanism is mounted below the opening and outside of the region of movement of the closure on the wall element.

3. The device according to claim 2, further characterized in that the vertical drive mechanism supports the sensor head on a pivoting head that has a horizontally directed pivot axis and is mounted on an arm that can be extended vertically.

4. The device according to claim 3, further characterized in that the pivot axis runs through a hollow shaft, on which the sensor head is placed and which can pivot between two terminal positions.

5. The device according to claim 1, further characterized in that the sensor head is designed as a forked light barrier, in which, at one end of the fork, a transmitter is mounted for emitting a measuring beam directed along a measuring beam path towards the other end of the fork and, at the other end of the fork, there is provided a beam deflection device, from which a coupled optical fiber leads outside of the measuring beam pathway by means of optics to a receiver at the one end of the fork in a lighttight manner.

6. The device according to claim 5, further characterized in that the forked light barrier is arranged so as to pivot around a horizontally directed pivot axis, which runs parallel to and at a spacing from the measuring beam path, so that the ends of the fork pass through the opening in the wall element when pivoting occurs around the pivot axis.

7. The device according to claim 6, further characterized in that the transmitter is designed as a laser.

8. The device according to claim 1, further characterized in that the transmitting and receiving device is equipped with its own electronic control and analysis unit, which is connected to a bus system of a central logic control.

9. The device according to claim 8, further characterized in that the vertical drive mechanism is constructed as a motor-spindle combination, which has an encoder for identifying the vertical positions, the encoder being linked to the electronic control and analysis unit of the transmitting and receiving device, the measured signals obtained from a receiver thereby being assigned to the positions determined.

10. The device according to claim 1, further characterized in that the sensor head is designed as a reflection measuring device, in which the transmitter and receiver are arranged next to each other on the sensor head.

* * * * *